United States Patent [19]
Murdoch et al.

[11] Patent Number: 5,860,128
[45] Date of Patent: Jan. 12, 1999

[54] METHOD AND APPARATUS FOR SAMPLING DATA FROM A MEMORY

[75] Inventors: Robert N. Murdoch, Sacramento; Michael W. Williams, Citrus Heights; Sathyamurthi Sadhasivan, El Dorado Hills, all of Calif.

[73] Assignee: Intel Corporation, Santa Clara, Calif.

[21] Appl. No.: 724,370

[22] Filed: Oct. 1, 1996

[51] Int. Cl.$^6$ ................................................. G06F 12/06
[52] U.S. Cl. ........................................... 711/167; 711/105
[58] Field of Search ..................................... 711/104, 105, 711/154, 167, 169; 365/189.05, 193

[56] References Cited

U.S. PATENT DOCUMENTS

| | | | |
|---|---|---|---|
| 5,261,068 | 11/1993 | Gaskins et al. | 711/157 |
| 5,465,343 | 11/1995 | Henson et al. | 711/112 |
| 5,490,114 | 2/1996 | Butler et al. | 365/189.07 |

*Primary Examiner*—Tod R. Swann
*Assistant Examiner*—Kevin L. Ellis
*Attorney, Agent, or Firm*—Blakely, Sokoloff, Taylor & Zafman

[57] ABSTRACT

A novel method for performing memory accesses. Falling edges of a column address strobe (CAS) signal are used to cause dynamic random access memories (DRAMs) to drive data corresponding to the current address onto a data bus coupled to the input of a set of latches. A memory latch data (MLAD) signal is used to enable the set of latches. When the MLAD signal is asserted, the latches latch the data at the input in response to a falling edge of the CAS signal. When the MLAD signal is deasserted, the latch does not latch the data at the input in response to the falling edge of the CAS signal. Since the same signal (CAS) is used to control when the data is driven by the DRAMs and when the data is latched by the latches, the differences in output timings, signal path delays, and loads are avoided. The use of expensive timing compensation circuits and special tuning of these circuits for each circuit board redesign is thereby avoided.

32 Claims, 11 Drawing Sheets

METHOD AND APPARATUS FOR SAMPLING DATA FROM A MEMORY

BACKGROUND OF THE INVENTION

1. Field of the Invention

The present invention relates to the field of computer systems; more particularly, the present invention relates to performing memory read operations in a computer system.

2. Description of Related Art

Data is stored in (as a result of write operations) and retrieved from (as a result of read operations) Dynamic Random Access Memories (DRAMs) at memory locations indicated by an address. The DRAMs are organized as an array of rows and columns of memory locations. A portion of the address specifies the row where the data is located (row address) and another portion of the address specifies the column where the data is located (column address). For DRAMs that store multiple data bits per address, the column address may correspond to several physical columns within each DRAM.

The row address and the column address are typically multiplexed onto the same address bus of each DRAM. When the row address is provided on the address bus, a row-address strobe (RAS) signal is asserted to produce an edge which indicates that the row address is valid. When the column address is provided, a column-address strobe (CAS) signal is asserted to produce an edge that indicates that the column address is valid. The CAS signal causes the data at that row address and column address to be driven on the outputs of each DRAM. If another column address is specified and CAS is asserted before RAS is deasserted, the data at this column within the same row is driven on the outputs of the device. When the row-address strobe (RAS) signal is deasserted, the columns of each DRAM are precharged for the next cycle(s). Data having the same row address is said to be within the same "page." By accessing columns within the same page without deasserting RAS, the time to precharge the columns is avoided thereby improving access time.

The outputs of the DRAMs are driven onto a data bus. It takes a certain amount of time to access the memory and drive the data on the data bus (access time) after the falling edge of the CAS signal. This data is only valid for a certain period of time. The signal that causes the data to be latched (LATCH signal) must be within the period in which the data is valid on the data bus to avoid data errors. The system designer may consider device manufacturing variations (some devices are faster than others), environmental variations (voltage and temperature, for example, affect device speed), load variations (the number of DRAMs in a system may change over time, the manufacturing variations of the circuit board affect capacitance, etc.) and other sources of uncertainty in controlling the timing of LATCH signal relative to the timing of the CAS signal. This technique tends to require large timing margins. Another technique is to employ a phase-locked-loop (PLL), delay line, or other timing compensation circuit to adjust the relative timing between the LATCH signal and the CAS signal. Although this does not require large timing margins, these circuits tend to be expensive and tend to require special tuning for each circuit board design. The timing margin available depends on the type of DRAMs used.

A fast page-mode DRAM strobes a column address and drives the corresponding data on the falling edge of the CAS signal. The corresponding data is driven until the rising edge of the CAS signal. The corresponding data is not driven during the period from the rising edge of the CAS signal to the next falling edge of the CAS signal. Since the latch must latch the data while the CAS signal is low, the CAS pulse must be relatively wide (several clock cycles) to meet timing margins. The use of a wide CAS pulse limits data throughput.

An extended data output (EDO) DRAM also strobes a column address and drives the corresponding data on the falling edge of the CAS signal until the next falling edge of the CAS signal (in which case the next data is driven) or until RAS is deasserted (in which case the bus is tristated). This allows the additional time during the period from the rising edge of the CAS signal to the next falling edge of the CAS signal to be used to latch the corresponding data. Since the latch may now latch the data while the CAS pulse is high, the CAS pulse can be narrowed to a single clock thereby improving data throughput.

A burst extended data output (BEDO) DRAM also drives the corresponding data on the falling edge of the CAS signal until the next falling edge of the CAS signal or until RAS is deasserted. However, a BEDO DRAM is distinguished from an EDO DRAM in that it returns several data elements for each address provided. In addition, a BEDO DRAM is distinguished from the EDO DRAM in that one falling edge of the CAS pulse causes the BEDO DRAM to strobe the address and internally access the corresponding data and the next falling edge of the CAS pulse causes the BEDO DRAM to drive the corresponding data. Since only one address is required for every several data elements, the timing constraints for the address signals are reduced. The reduced timing constraints permit the CAS pulse to be narrowed to half a clock which further improves throughput. The narrower CAS pulse-width requires greater control of the timing of the LATCH signal relative to the timing of the CAS signal. The narrow CAS pulse width generally precludes the use of timing margins to guard against variations in timings of the LATCH and CAS signals. However, the greater sensitivity to the variation in timings is tolerated because the BEDO DRAM achieves higher performance than the EDO DRAM or the fast page-mode DRAM.

What is needed is a method to control the timing of the LATCH signal relative to the timing of the CAS signal without expensive PLL, delay line, or other timing compensation circuits. What is needed is a method to control the timing of the LATCH signal relative to the timing of the CAS signal without requiring special tuning for each circuit board design.

SUMMARY OF THE INVENTION

A method and apparatus for performing memory accesses comprising the steps of producing a first edge of a first signal, driving a first data in response to the first edge, driving a second signal into a first state, producing a second edge of the first signal, and latching the first data in response to the second edge of the first signal and the first state of the second signal.

DETAILED DESCRIPTION

The present invention uses a column-address strobe (CAS) signal to control both when data is driven by a memory and when a latch latches the driven data. Since the same signal is used to control both events, compensation for the differences in output timings, signal path delays, and loads is avoided, thus eliminating the need for expensive PLLs, delay lines, or other timing compensation circuits. It follows that the elimination of timing compensation circuits eliminates the need to perform special tuning for each circuit board redesign. In the following description, details of the method and apparatus to perform read cycles according to the present invention is described. A device incorporating the teachings of this invention herein may perform write cycles as well as read cycles. Write cycles are not described in detail in order to avoid obscuring the present invention. Although particular types of memories are discussed, it will be apparent to one skilled in the art that the present invention may be practiced using other types of memory.

A memory latch data (MLAD) signal is used to disable and enable a data latch in response to the CAS signal. More particularly, when the MLAD signal is deasserted, an edge of the CAS signal causes data to be driven by the memory, but does not cause any data on the input of the latch (driven as a result of a previous edge of the CAS signal) to be latched. When the MLAD signal is asserted, an edge of the CAS signal causes data to be driven by the memory and causes the data on the input of the latch (driven as a result of a previous edge of the CAS signal) to be latched.

The convention followed in describing the method and apparatus below is that the bus names correspond to the signal names on that bus. For example, an A signal is on an A bus. The complement of a signal may be referred to by appending an "#" after the signal name. For example, the complement of the A signal on the A bus is the A# signal the A# bus. A signal A/B# indicates that A is true when the signal is asserted and B is true when the signal is deasserted.

Figure 1:
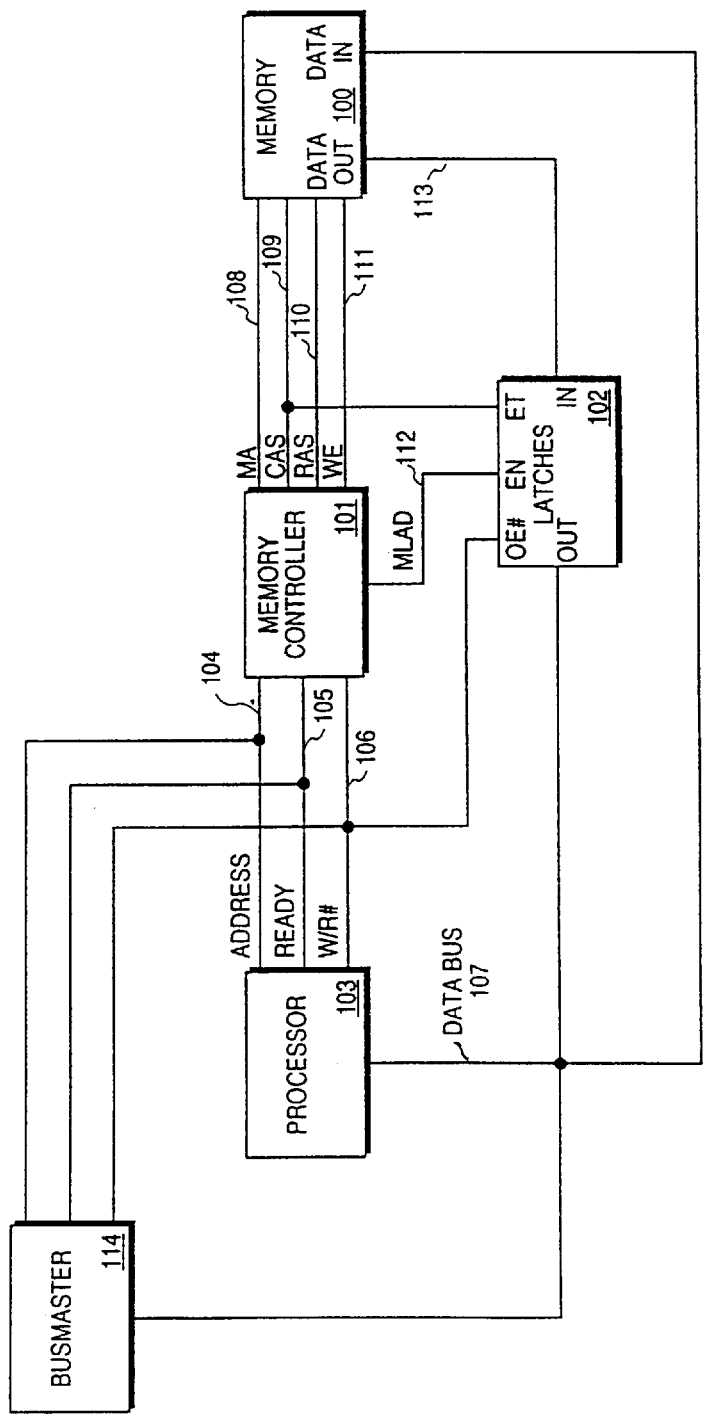
FIG. 1 illustrates one embodiment of the computer system of the present invention.

FIG. 1 illustrates one embodiment of a computer system of the present invention. A processor 103 is coupled to a memory controller 101 through an address bus 104, a READY bus 105, and a write/read# (W/R#) bus 106. A busmaster 114 is coupled to the memory controller 101 through the address bus 104, the READY bus 105, and the W/R# bus 106. The processor 103 and the busmaster 114 send write and read requests to the memory controller 101. A memory 100 is coupled to the memory controller 101 through a multiplexed address (MA) bus 108, a CAS bus 109, a row-address strobe (RAS) bus 110, and a write-enable (WE) bus 111. The memory controller 101 uses the MA, CAS, RAS, and WE signals to write and read data from the memory 100 in response to the write and read requests received from the processor 103 and the busmaster 114. A data input (IN) of a set of latches 102 are coupled to the memory through a data bus 113. An enable (EN) input and an edge trigger (ET) input of the set of latches 102 are coupled to the memory controller 101 through an MLAD bus 112 and the CAS bus 109, respectively. The memory controller 101 uses these signals to specify whether to latch the data (if the MLAD signal is asserted) and if so, when to latch the data (at an edge of the CAS signal). A data output (OUT) and an output enable# (OE#) input of the set of latches 102 are coupled to the processor 103 and the busmaster 114 through a data bus 107 and the W/R# bus 106, respectively. The W/R# signal disables the output of the set of latches 102 (by deasserting the OE# input) during a write operation so that the processor 103 or the busmaster 114 can drive the data onto the data bus 107. The W/R# signal enables the output of the set of latches 102 (by asserting the OE# input) during a read operation so that the processor 103 or the busmaster 114 can read the data driven by the set of latches 102 when the memory controller 101 asserts the READY signal.

In one embodiment, the memory 100 includes burst extended data output (BEDO) DRAMs. In another embodiment, the memory 100 includes a combination of fast page-mode DRAMs and/or extended data output (EDO) DRAMs in addition to BEDO DRAMs. It will be apparent to one skilled in the art that other memory devices may be used. In another embodiment, an address bus may be used to specify the complete address in a single cycle rather than multiplexing the address on the MA bus 108. In other embodiments, additional busmasters may be used. Busmasters may include direct memory access (DMA) devices and peripheral component interconnect (PCI) devices, for example. However, it will be apparent to one skilled in the art that the present invention may be practiced by any device capable of initiating data requests to another device.

In one embodiment, the memory controller 101 and the processor 103 or the busmaster 114 may be integrated on a single device which communicates with the memory 100 and the set of latches 102 using the method of the present invention. In still another embodiment, the memory controller 101, the set of latches 102, and the processor 103 or the busmaster 114 may be integrated on a single device which communicates with the memory 100 using the method of the present invention.

Figure 2:
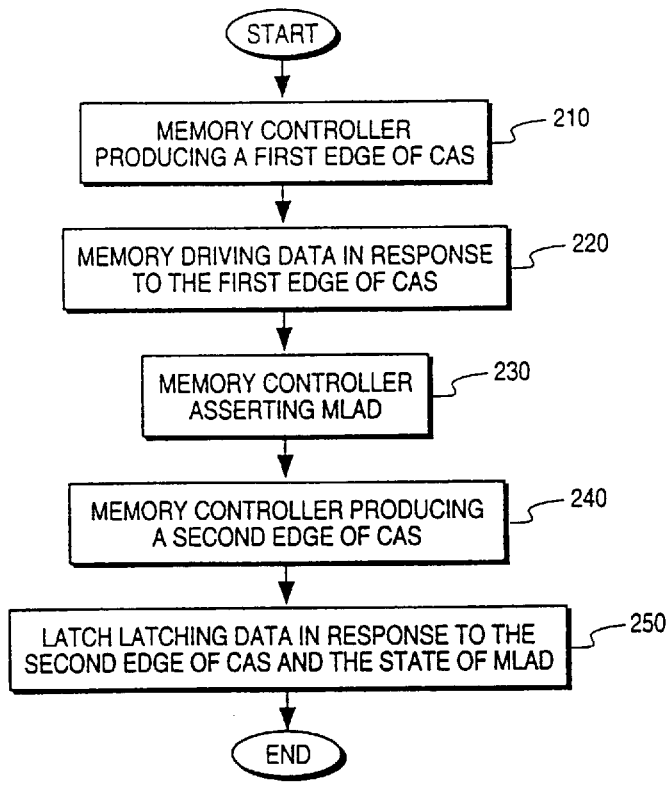
FIG. 2 is a flow diagram of one embodiment of the method of performing a memory access.

FIG. 2 is a flow diagram of one embodiment of the method of performing a memory access in a system such as the computer system of FIG. 1.

In step 210, the memory controller 101 asserts and then deasserts the CAS signal to produce a pulse which has a first falling edge and a first rising edge.

In step 220, the memory 100 drives a first data onto the data bus 113 in response to the first falling edge of the CAS signal. In one embodiment, the address of the first data is strobed using RAS and CAS according to well-known methods. In such an embodiment, a portion of the address for the first data is strobed on a falling edge of RAS and another portion of the address for the first data is strobed in a falling edge of CAS before the first falling edge indicated above and after the falling edge of RAS. It will be apparent to one skilled in the art that other methods of specifying the address of the first data may be used.

In step 230, the memory controller 101 asserts the MLAD signal which enables the set of latches 102. The MLAD signal is asserted at a time such that it enables the latch sometime after the first falling edge of the CAS signal but before the subsequently described second falling edge of the CAS signal. The timing of the MLAD signal is therefore less critical than the timing of the CAS signal.

In step 240, the memory controller 101 asserts and then deasserts the CAS signal to produce a pulse which has a second falling edge and a second rising edge. This second falling edge of the CAS signal is used to perform the function of the LATCH signal of the prior art when the MLAD signal enables the set of latches 102. The set of latches 102 latches the data from the data bus 113 and drives that data onto the data bus 107. The relative timing of the first falling edge of the CAS signal to the second falling edge of the CAS signal can be more readily controlled than the relative timing of two separate signals since differences in output timings, signal path delays, and loads of two separate signals are avoided.

In step 250, the set of latches 102 latches the data in response to the second falling edge of the CAS signal and the state of the MLAD signal.

Numerous variations of the method illustrated in FIG. 2 may be implemented. In one embodiment, the memory 100 drives a second data in response to the second falling edge of the CAS signal. Furthermore, it is preferred that the memory 100 computes the address for the second data using an algorithm which depends on a portion of a prior address and predetermined burst orders. Alternatively, the memory 100 strobes at least a portion of an address for the second data in response to the first falling edge of the CAS signal.

It will be apparent to one skilled in the art that other edges may be used to indicate the timing of various events described in the method of FIG. 2. For example, the driving of the data and/or the latching of the data may be performed in response to the corresponding rising edges of the CAS signal. Alternatively, the driving of the data and/or the latching of the data may be performed in response to either a rising or a falling edge of the CAS signal.

Figure 3:
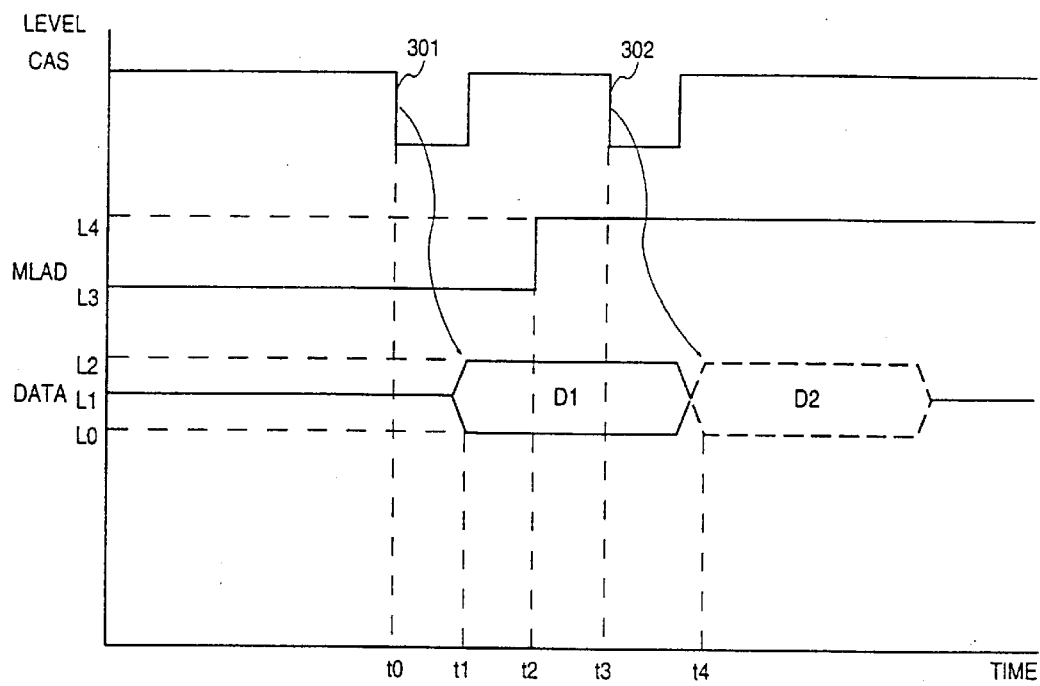
FIG. 3 is a timing diagram illustrating a memory access in accordance with the teachings of the present invention.

FIG. 3 is a timing diagram illustrating one embodiment of the read process. Referring to FIG. 3, when the MLAD signal is at level L3, the set of latches 102 is disabled. When the MLAD signal is at level L4, the set of latches 102 is enabled. The memory controller 101 asserts and then deasserts the CAS signal to produce a falling edge 301 at time t0 which causes the memory 100 to drive the DATA signal to valid levels (level L0 or level L2) to represent data D1 on the data bus 113 at time t1. At other times, the data may be at an intermediate level, tri-state level L1. There is some delay from the time of the falling edge 301 at time t0 to when data D1 is represented on the data bus 113 at time t1 because the memory must drive the data onto the data bus. What occurs during this delay is implementation specific. In some implementations, the delay is due to the time required to access the data from the internal memory array within the memory 100 and to drive the data onto the data bus 113. Alternatively, the data is accessed from the internal memory array and latched within the memory 100 in response to a previous falling edge of the CAS signal and the delay is due to the time required to drive the internally latched data onto the data bus 113. It will be apparent to one skilled in the art that other memory access sequences may be used.

The memory controller 101 drives the MLAD signal from level L3 to level L4 at time t2. The MLAD signal should be asserted at a time such that it enables the latch sometime after time t0 but before time t3. The memory controller 101 asserts and then deasserts the CAS signal to produce a falling edge 302 on the CAS signal at time t3 which causes the set of latches 102 (which are enabled) to latch data D1 at time t3. In one embodiment, the falling edge 302 also causes the memory 100 to drive the DATA signal to valid levels to represent data D2 at time t4. Although the driving of the next data on the data bus 113 and the latching of the current data on the data bus 113 may be initiated by the same falling edge 302 of the CAS signal, data corruption is avoided because the latching is performed before the new data is driven onto the data bus 113. As illustrated above, the relative timing of the second edge of the CAS signal to the first edge of the CAS signal can be more readily controlled than the relative timings of two signals that independently control the driving and latching of data. Thus, the second edge of the CAS signal can be within a narrow window of time in which the data has been driven onto the data bus 113 but has not been overwritten by the subsequent data without using expensive timing compensation circuits that often require retuning when the board is redesigned.

BEDO DRAMs do not strobe column addresses for every falling edge of the CAS signal. After the RAS signal is asserted or the WE signal is pulsed, a state machine enters the state in which the next falling edge of the CAS signal causes at least a portion of an address (COLUMN address) to be strobed. After a COLUMN address is strobed, subsequent addresses are computed based on the strobed COLUMN address in a predetermined order and length. Typically, the subsequent addresses correspond to portions of a "cache line" in the device requesting the data. Such accesses are known as burst cycles. When the number of CAS pulses correspond to a complete burst cycle (e.g., four CAS pulses for a four data burst cycle), the state machine returns to the state in which the next falling edge of the CAS signal will cause another address to be strobed. This address will be used for the next burst cycle.

Figure 4A:
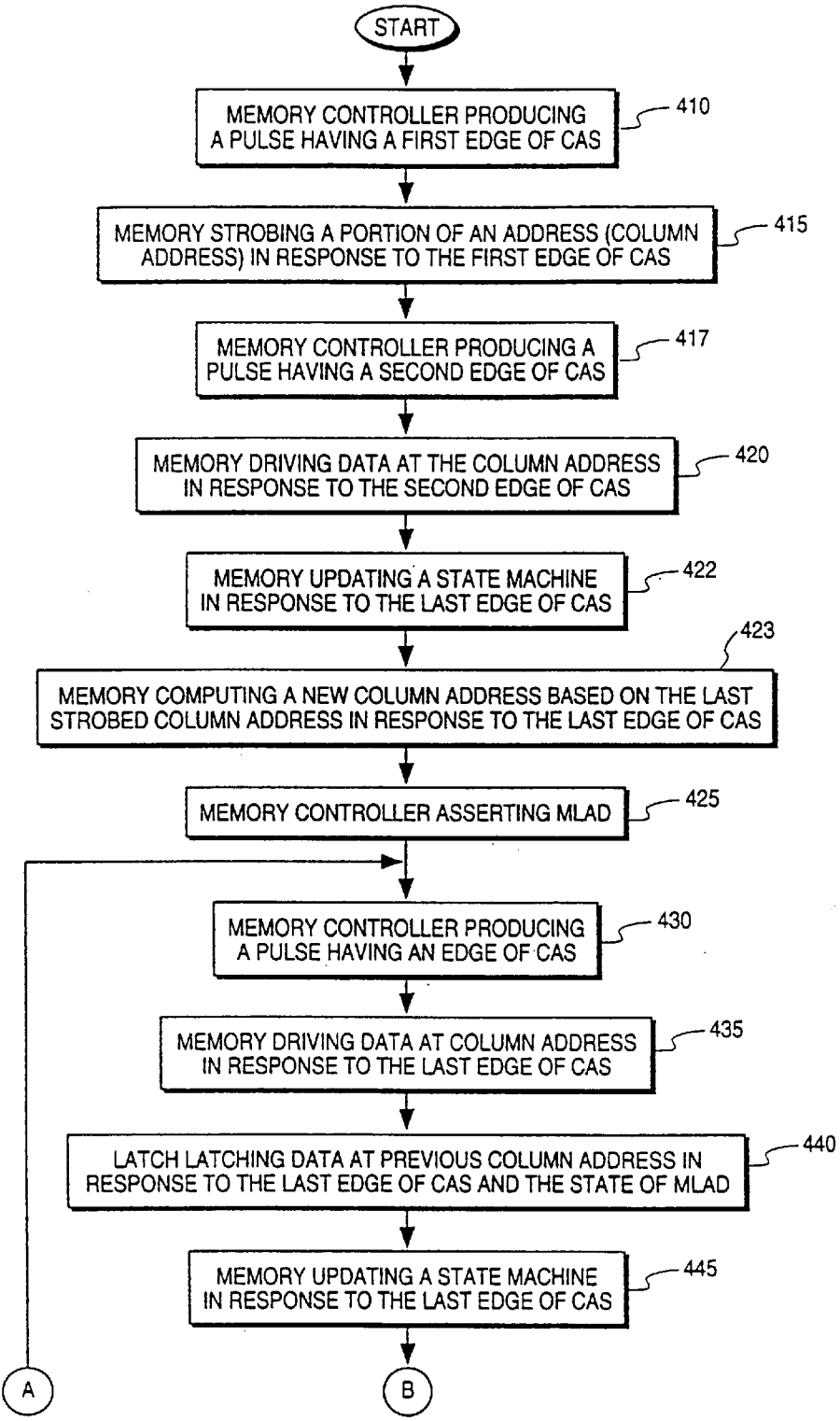
FIGS. 4a and 4b illustrate a flow diagram of one embodiment of the method of performing a burst read of a BEDO DRAM.
Figure 4B:
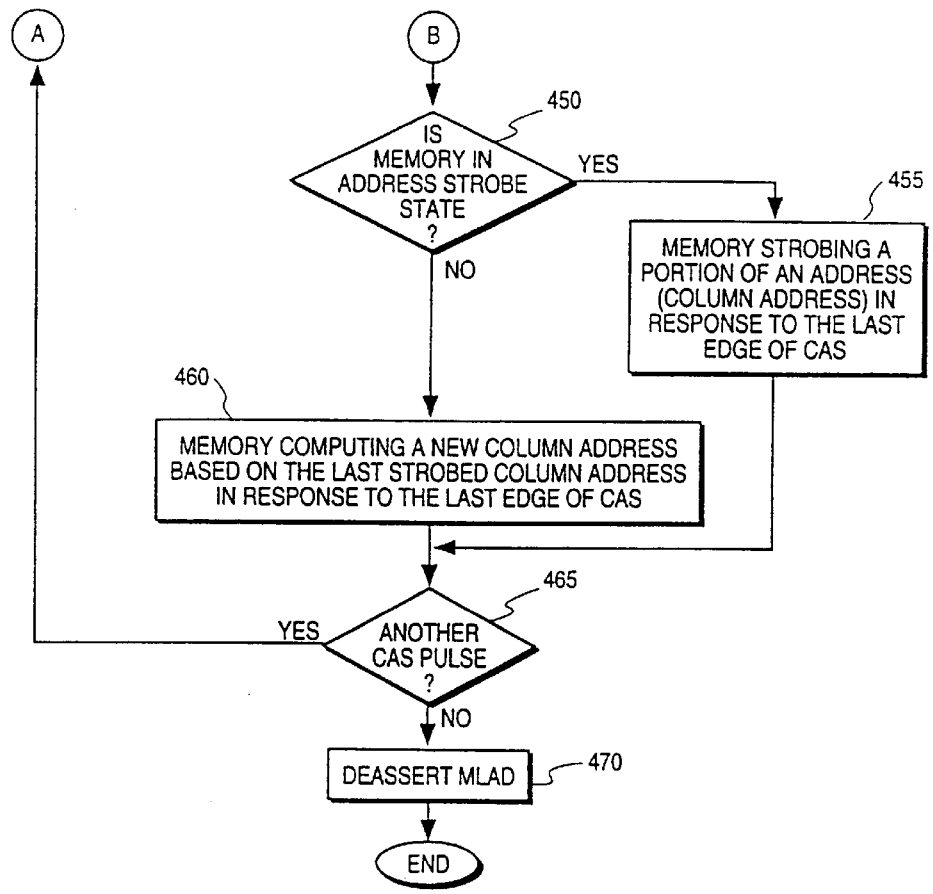

FIGS. 4a and 4b illustrate a flow diagram of one embodiment of a method of performing a burst read of a BEDO DRAM a system such as the computer system of FIG. 1. In the illustrated embodiment, the data pipeline is two read operations deep rather than one. A first CAS pulse causes an address to be strobed or computed and a data at that address to be internally accessed. A second CAS pulse causes that data to be driven. It will be apparent to one skilled in the art that a single CAS pulse may be used to access and drive a data at a particular address. Alternatively, deeper data pipelines may be used. In other embodiments, other memories capable of performing burst cycles may be used.

In step 410, the memory controller 101 asserts and then deasserts the CAS signal to produce a pulse which has a first falling edge and a first rising edge.

In step 415, the memory controller 101 strobes a portion of the first address (COLUMN address) in response to the first falling edge of the CAS signal. In another embodiment, a portion of the address (ROW address) is provided to or computed by the memory 100 before the first falling edge of the CAS signal.

In step 417, the memory controller 101 asserts and then deasserts the CAS signal to produce a pulse which has a second falling edge and a second rising edge.

In step 420, the memory 100 drives data at the COLUMN address in response to the second falling edge of the CAS signal. In one embodiment, the COLUMN address may represent the entire address. In another embodiment, another portion of the address (ROW address) is either strobed or computed such that the entire address is represented as (ROW address):(COLUMN address) (this notation represents an address consisting of ROW address concatenated with COLUMN address such that ROW address is the most significant bits of the address and COLUMN address is the least significant bits of the address). It will be apparent to one skilled in the art that other methods of determining the address may be used.

In step 422, the memory 100 updates a state machine that indicates whether to strobe a new address (COLUMN address) for the beginning of a burst cycle (address strobe state) or to use the first address to compute the new address (COLUMN address) for the subsequent cycles of a burst cycle (non-address strobe state).

In step 423, since the memory 100 is not in an address strobe state, the memory 100 computes a COLUMN address based on the last strobed COLUMN address in response to the last falling edge of the CAS signal. The function for determining the COLUMN address based on the last strobed COLUMN address is represented as function(strobed COLUMN address, cycle) where cycle represents the cycle number of the burst cycle (e.g. 2,3,or 4 for a four-cycle burst cycle).

In step 425, the memory controller 101 asserts the MLAD signal. The MLAD signal is asserted at a time such that it enables the latch sometime after the second falling edge of the CAS signal but before the next falling edge of the CAS signal. The timing of the MLAD signal is less critical than the timing of the CAS signal.

In step 430, the memory controller 101 asserts and then deasserts the CAS signal to produce a pulse which has a falling edge and a rising edge.

In step 435, the memory 100 drives data at the COLUMN address in response to the last falling edge of the CAS signal.

In step 440, the set of latches 102 latches the data at the previous COLUMN address in response to the last falling edge of the CAS signal and the MLAD signal being asserted.

In step 445, the memory 100 updates a state machine that indicates whether to strobe a new address (COLUMN address) for the beginning of a burst cycle (address strobe state) or to use the first address to compute the new address (COLUMN address) for the subsequent cycles of a burst cycle (non-address strobe state).

In step 450, the memory 100 determines whether to strobe the COLUMN address based on the state of the state machine.

In step 455, if the memory 100 is in the address strobe state, the memory 100 strobes the COLUMN address in response to the last falling edge of the CAS signal.

In step 460, if the memory 100 is not in the address strobe state, the memory 100 computes a COLUMN address based on the last strobed COLUMN address in response to the last falling edge of the CAS signal.

In step 465, the memory controller 101 determines whether another cycle is to be performed. If there is another cycle to be performed, the method continues at step 430. In one embodiment, additional CAS pulses may be generated even though the requested data has been accessed as described in more detail below.

In step 470, the MLAD signal is deasserted.

Figure 5:
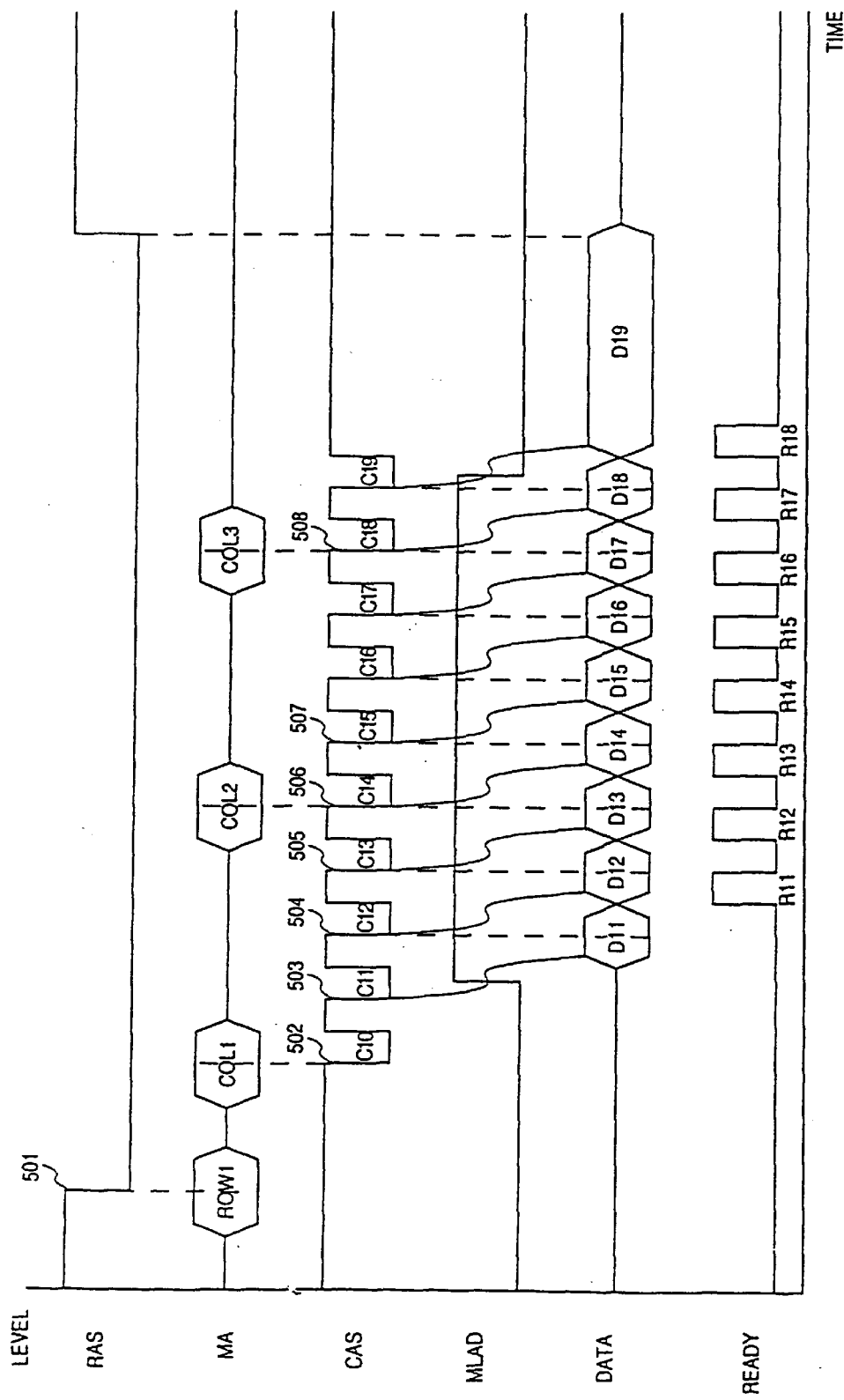
FIG. 5 is a timing diagram illustrating a burst read of a BEDO DRAM in accordance with the teachings of the present invention.

FIG. 5 is a timing diagram illustrating the above process described with respect to FIGS. 4a and 4b.

When the MLAD signal is asserted, the set of latches 102 are enabled. When the MLAD signal is deasserted, the set of latches 102 are disabled. The memory controller 101 drives a first portion of an address (ROW1 address) on the MA bus 108 and asserts the RAS signal to produce a falling edge 501 which causes the memory 100 to strobe the ROW1 address. The ROW1 address is common to all addresses until the RAS signal is deasserted.

The memory controller 101 drives a second portion of the address (COL1 address) on the MA bus 108 and asserts and then deasserts the CAS signal to produce a pulse C10 having a falling edge 502 which causes the memory 100 to strobe the COL1 address. The memory controller 101 asserts and then deasserts the CAS signal to produce a pulse C11 having a falling edge 503. The memory 100 drives the DATA signal to represent the data located at the address (ROW1 address) :(COL1 address) (data D11) in response to the falling edge 503.

The memory controller 101 then asserts the MLAD signal to enable the set of latches 102. The memory controller 101 asserts and then deasserts the CAS signal to produce a pulse C12 having a falling edge 504 which causes the set of latches 102 to latch data D11 and causes the memory 100 to drive the data located at address (ROW1 address):function (COL1 address,2) (data D12) on the data bus 113. The memory controller 101 asserts then deasserts the READY signal to produce a pulse R11 which indicates that the set of latches 102 is driving data D11 on the data bus 107 so that the processor 103 or the busmaster 114 may latch data D11.

The memory controller 101 asserts and then deasserts the CAS signal to produce a pulse C13 having a falling edge 505 which causes the set of latches 102 to latch data D12 and causes the memory 100 to drive the data located at address (ROW1 address):function(COL1 address,3) (data D13) on the data bus 113. The memory controller 101 drives pulse R12 on the READY signal to indicate that the set of latches 102 is driving data D12 on the data bus 107 so that the processor 103 or the busmaster 114 may latch data DI2.

The memory controller 101 drives a portion of a second address (COL2 address) on the MA signal and asserts and then deasserts the CAS signal to produce a pulse C14 having a falling edge 506 which causes the memory 100 to strobe the COL2 address. The falling edge 506 also causes the set of latches 102 to latch data D13 and drive the data located at address (ROW1 address):function(COL1 address,4) (data D14) on the data bus 113. The memory controller 101 drives pulse R13 on the READY signal to indicate that the set of latches 102 is driving data D13 on the data bus 107 so that the processor 103 or the busmaster 114 may latch data D13.

The memory controller 101 then asserts and then deasserts the CAS signal to produce a pulse C15 having a falling edge 507. The falling edge 507 causes the set of latches 102 to latch data D14 and drive the data located at address (ROW2 address):(COL2 address) (data D15) on the data bus 113. The memory controller 101 drives pulse R14 on the READY signal to indicate that the set of latches 102 is driving data D14 on the data bus 107 so that the processor 103 or the busmaster 114 may latch data D14. Similarly, pulse C16, pulse C17, and pulse C18 cause the memory 100 to drive data D16, data D17, and data D18, respectively, and pulse C17, pulse C18, and pulse C19 cause the set of latches 102 to latch data D16, data D17, and data D18, respectively. Pulses R15 to R18 indicate that the set of latches 102 are driving data D15 to data D18, respectively, on the data bus 113 so that the processor 103 may latch data D14 to data D18, respectively.

The typical DRAM does not include logic to distinguish a CAS pulse meant to simply cause the set of latches 102 to latch data and a CAS pulse meant to cause the memory 100 to drive data or strobe an address. Therefore, it is preferred that the memory controller 101 drives a portion of an address (COL3 address) on the MA bus 108 when it produces the pulse C18 having a falling edge 508 in order to latch data D17 and drive data D18. The memory 100 maintains a state machine that causes it to strobe an address every fourth CAS pulse. There may not be an outstanding request for data at the COL3 address but the memory controller 101 generates the COL3 address in order to provide a valid address to the memory 100. In response to pulse C19, the memory 100 drives the data located at address (ROW1 address):(COL3 address) (data D19) on the data bus 113. Data D19 is driven by the memory 100 as a byproduct of the latching of data D18. In one embodiment, the COL3 address is produced by incrementing the COL2 address to point to the next cache line in order to anticipate subsequent data requests. It will be apparent to one skilled in the art that other algorithms may be used to generate a COL3 address in anticipation of a subsequent data request.

Each data is driven onto the data bus 113 until a subsequent data element is driven in response to a CAS pulse or the RAS pulse is deasserted. Data D11 through D18 are driven until the subsequent data element is driven and Data D19 is driven until the RAS signal is deasserted. Alternatively, the DATA signal is driven until the CAS signal is deasserted. In one embodiment, the DATA signal transitions to a tristate level whenever it is not being driven.

Pulses C18 and C19 cause the memory 100 to drive data D18 and data D19 and the set of latches 102 to latch data D17 and data D18. In addition, pulses C18 and C19 cause the state machine of the memory to be in a state where the next pulse of the CAS signal will not strobe a new portion of the address. The state machine of the memory 100 returns to the address strobe state every fourth CAS pulse. A typical DRAM does not distinguish the CAS pulse meant to simply cause the set of latches 102 to latch data and one to cause the memory 100 to update the state machine. Since a burst cycle using the method described above uses six CAS pulses rather than four CAS pulses, the state machine is not left in the address strobe state for a subsequent burst cycle.

One method of forcing the memory 100 to return to the address strobe state is to deassert the RAS signal according to well-known methods. However, this has the disadvantage of requiring that a certain precharge time elapse before the DRAM is ready to be accessed again. Another method of forcing the memory 100 to return to the address strobe state is to pulse the WE signal according to well-known methods. However, it may take several clock cycles to pulse the WE signal since the WE bus is one of the most heavily loaded signals in the computer system. Techniques to reduce the number of clock cycles required to pulse the WE signal, such as tightly controlling the loads and carefully routing the WE signal, using expensive buffering, and driving the WE signal through multiple pins, are relatively expensive and sensitive to variations in system design. Therefore, it is desirable to assert extra CAS pulses or withhold unnecessary CAS pulses in order to place memory 100 in an address strobe state.

Figure 6:
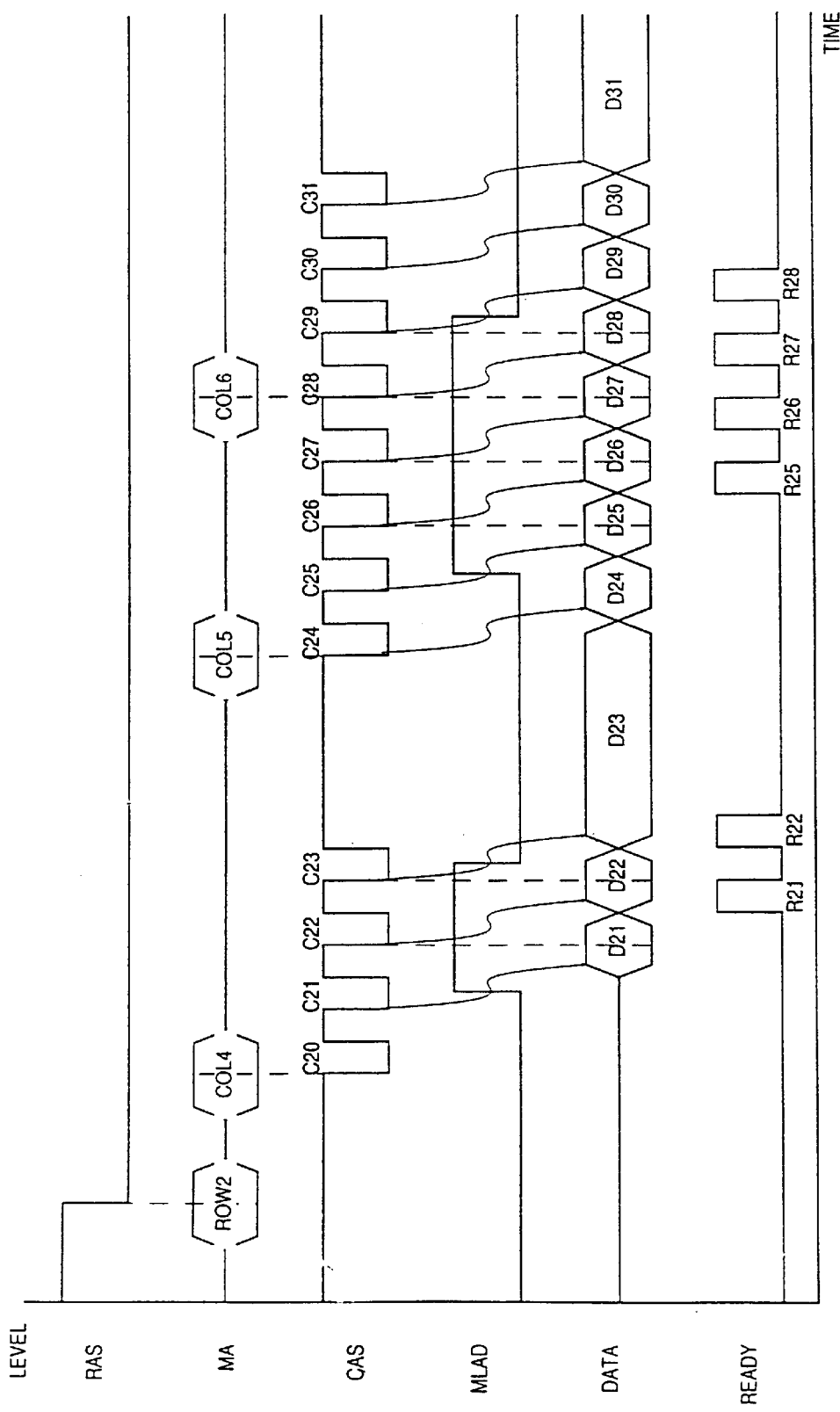
FIG. 6 is a timing diagram illustrating the method of preparing a BEDO DRAM to strobe at least a portion of an address on the next read cycle after performing a burst read in accordance with the teachings of the present invention.

FIG. 6 is a timing diagram that illustrates the case where unnecessary CAS pulses are not issued in order to leave the memory 100 in an address strobe state for the next data request. This occurs, for example, when the processor 103 or the busmaster 144 requests two of the four data elements of a block of data. The memory controller 101 may still be able to retrieve the data faster by issuing a burst cycle in which the two data elements are the first two of four data to be retrieved, for example. By initiating a burst cycle and aborting the burst cycle after the requested data has been provided (i.e., not issuing the CAS pulses to latch the last two data), a total of four CAS pulses are issued and the memory 100 is left in the address strobe state.

The ROW2 address and the COL4 address are strobed as described above. The memory controller 101 drives pulses C20 through C23 to cause the memory to drive data D21 through D23. The memory controller asserts the MLAD signal after the falling edge of pulse C21 to enable the set of latches 102. Pulses C22 and C23 cause the set of latches 102 to latch data D21 and data D22, respectively. Pulses R21 and R22 indicate that the data D21 and the data D22 are being driven on the data bus 107 and may be latched by the processor 103 or the busmaster 114.

In the case where the processor 103 or the busmaster 114 did not request data D23 and data D24, the CAS pulses required to strobe them are not issued in order to leave the memory 100 in the address strobe state for the next data request. However, data D23 and data D24 are driven by the memory 100 as a byproduct of pulse C23, which is used to latch data D22, and Pulse C24, which is used to strobe the address of the next data sequence, respectively. Data D23 and data D24 are not latched by the set of latches 102 (MLAD is deasserted) because data D23 and data D24 are not requested by the processor. It will be apparent to one skilled in the art that CAS pulses may not be issued in other situations depending on the number of CAS pulses required for each burst cycle and the depth of the pipeline, for example. In another embodiment, Data D23 and data D24 may be latched by the set of latches 102 (MLAD is asserted), but corresponding pulses of the READY signal will not be issued since the processor 103 or the busmaster 114 has not requested this data.

FIG. 6 illustrates the case in which extra CAS pulses are issued to leave the memory 100 in an address strobe state for the next data request. The COL5 address is strobed according to the method described above. The memory controller 101 drives pulses C24 through C28 to cause the memory to drive data D24 (a byproduct of pulse C24 as described above) and data D25 through data D28 which is requested by the processor 103 or the busmaster 114. The memory controller asserts MLAD after the falling edge of pulse C25 to enable the set of latches 102. Pulses C26 through C29 cause the set of latches 102 to latch data D25 through data D28, respectively. Pulses R25 through R28 indicate that data D25 through data D28, respectively, are being driven on the data bus 107 and may be latched by the processor 103 or the busmaster 114. As described above, the memory controller 101 produces a COL6 address to provide a valid address to the memory 100 even if there is not an outstanding memory request. Pulses C28 and C29 are used to latch the data D27 and D28, respectively, but these pulses also cause the state machine of the memory 100 to be in a state where the next pulse of the CAS signal will not strobe a new portion of the address.

The memory controller 101 asserts pulses C30 and C31 which causes the memory 100 to advance its state machine to the address strobe state in preparation for the next memory request. The memory 100 drives data D29 through D31 as a byproduct of Pulses C29 through C31, respectively. It will be apparent to one skilled in the art that CAS pulses may be issued in other situations depending on the number of CAS pulses required for each burst cycle and the depth of the pipeline, for example.

Different devices may have different burst orders. For the purposes of discussion below, the integers from 0 to 3 represent portions of a cache line from the lowest address to the highest address. The first number of each hyphenated sequence corresponds to the first address of the cycle as determined from the requesting device. The second, third, and fourth numbers correspond to the subsequent addresses of the four cycle burst. The burst order is defined by the four possible sequences depending on the four possible first addresses. As described above, the address for each cycle number in the burst sequence may therefore be represented as a function(portion of the first address, cycle number).

For example, the Pentium® processor (Pentium is a registered trademark of Intel Corporation) uses a burst order of 0-1-2-3, 1-0-3-2, 2-3-0-1, and 3-2-1-0, which is known as an interleaved burst order. Other devices may use a burst order of 0-1-2-3, 1-2-3-0, 2-3-0-1, and 3-0-1-2, which is known as a linear burst order. It will be apparent to one skilled in the art that other burst orders may be used.

In one embodiment, the burst order of the processor 103 or the busmaster 114 and the memory 100 are different. For example, the busmaster 114 may request data in linear order with arbitrary lengths. Possible linear order requests less than or equal to 4 cycles long are identified in the Linear Order column of Table 1. The memory 100 may provide data in an interleaved order, such as the one described above. Possible interleaved order requests less than or equal to 4 cycles long are identified in the Interleaved Order column of Table 1. The number of cycles in each entry of the Interleaved Order column of Table 1 is limited to those required to provide the requested data presented in the Linear Order column of Table 1.

In most cases, the linear access order and the interleaved access order are identical. In the two cases that they are not, the linear order may be achieved by decrementing the requested start address and ignoring the first value that is returned. The order in which the data elements are accessed is indicated in the Access Order column of Table 1. The cases in which the address is decremented to synchronize the interleaved burst order with the linear burst order are identified in the Decrement Address column of Table 1.

Data that is accessed may be ignored if it is generated as a byproduct of some other effect of a CAS pulse such as latching or driving another data. Data may be ignored by pulsing the CAS signal to drive the data out and updating the state machine and the address counter, but not pulsing the READY signal. The cases in which the READY signal is not issued for particular cycles that are accessed is indicated in the Skip READY column of Table 1.

Table 1 also includes an Extra CAS Pulses column that indicates how many extra CAS pulses in addition to the one that drives the last required data element are needed to return the memory 100 into the address strobe state assuming that the burst cycle is 4 cycles long.

TABLE 1

| Burst Order Translation | | | | | |
| --- | --- | --- | --- | --- | --- |
| Linear Order | Interleaved Order | Access Order | Decrement Address | Extra CAS Pulses | Skip READY |
| 0-1-2-3 | 0-1-2-3 | 0-1-2-3 | No | 2 Extra | No |
| 0-1-2 | 0-1-2 | 0-1-2 | No | 3 Extra | Skip 3 |
| 0-1 | 0-1 | 0-1 | No | None | Skip 2-3 |
| 0 | 0 | 0 | No | 1 Extra | Skip 1-2-3 |
| 1-2-3 | 1-0-3-2 | 0-1-2-3 | Yes | 2 Extra | Skip 0 |
| 1-2 | 1-0-3-2 | 0-1-2 | Yes | 3 Extra | Skip 0 |
| 1 | 1 | 1 | No | 1 Extra | Skip 2-3 |
| 2-3 | 2-3 | 2-3 | No | None | Skip 0-1 |
| 2 | 2 | 2 | No | 1 Extra | Skip 3-0-1 |
| 3 | 3 | 3 | No | 1 Extra | No |

Figure 7A:
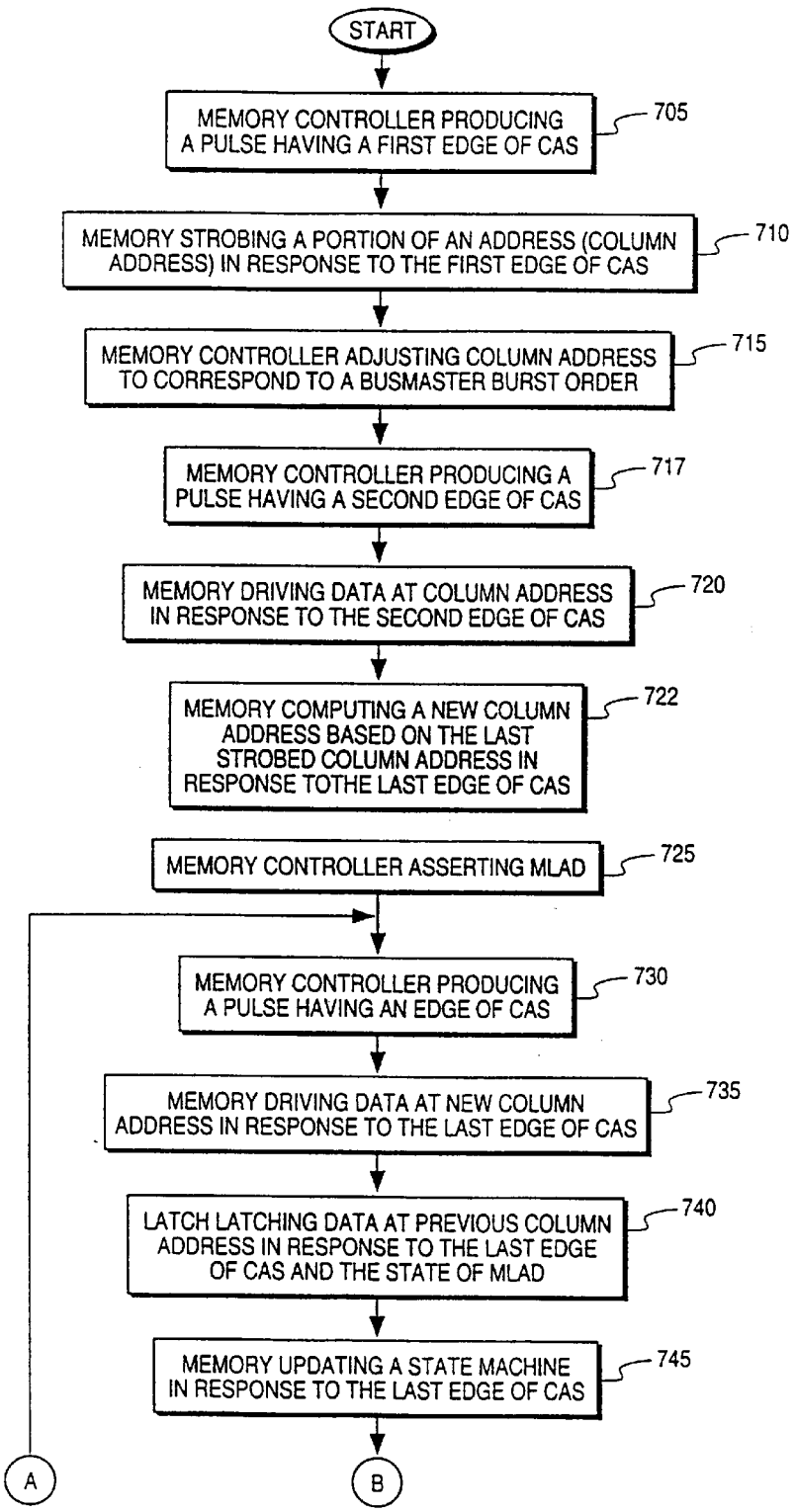
FIGS. 7a and 7b illustrate a flow diagram of one embodiment of the method of adjusting the first address of a burst order to synchronize the memory burst order with the requesting device burst order.
Figure 7B:
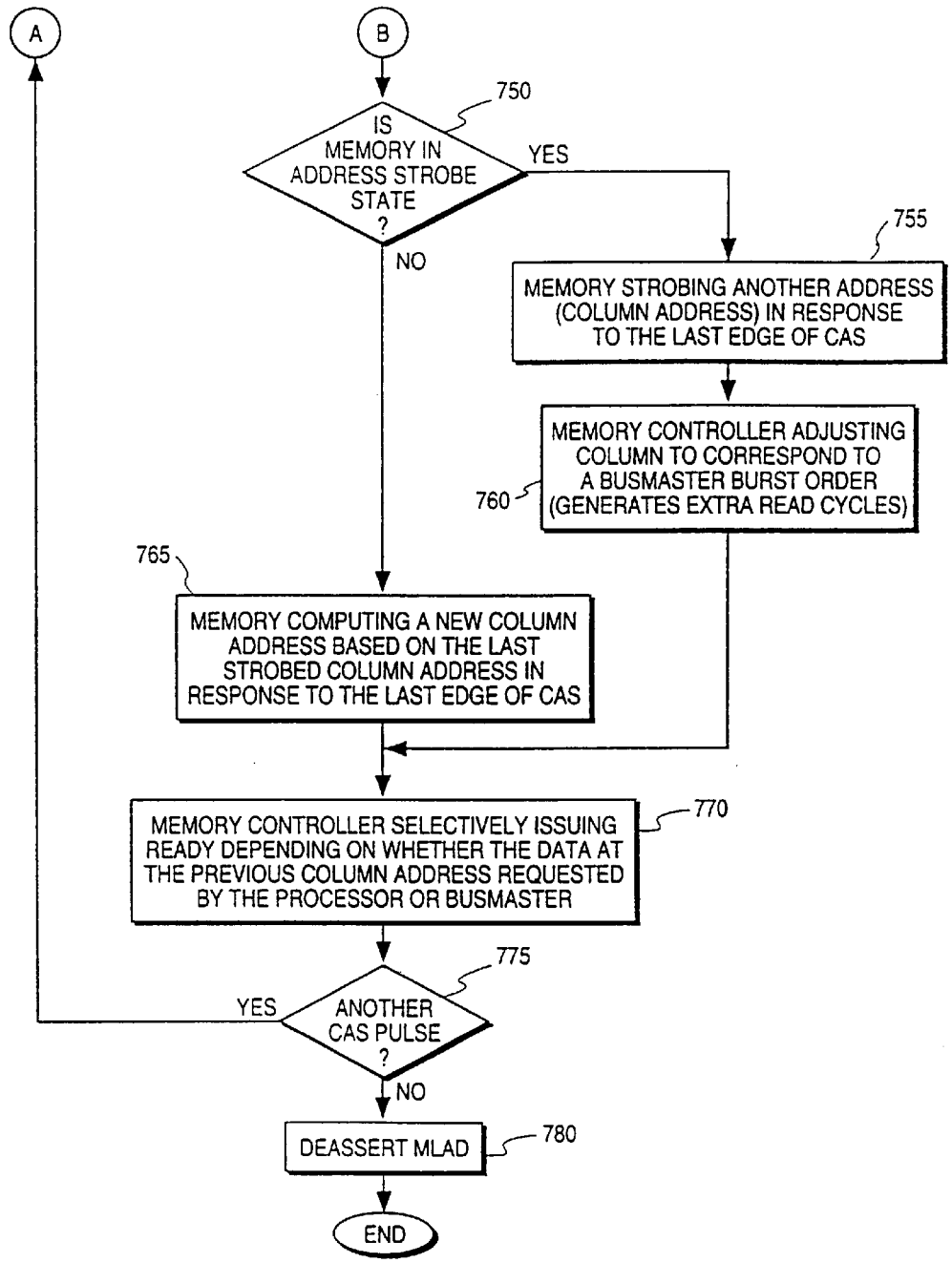

FIGS. 7a and 7b illustrate a flow diagram illustrating one embodiment of the method of adjusting the first address of a burst order to synchronize the memory burst order with the requesting device burst order in a system such as the computer system of FIG. 1.

In step 705, the memory controller 101 asserts and then deasserts the CAS signal to produce a pulse having a first edge.

In step 710, the memory controller 101 strobes a portion of the first address (COLUMN address) in response to the first edge of the CAS signal. In another embodiment, at least a portion of the address is provided to the memory 100 before the first edge of the CAS signal. In one embodiment, COLUMN address may represent the entire address. In another embodiment, another portion of the address (ROW address) is either strobed or computed such that the entire address is represented as (ROW address):(COLUMN address). It will be apparent to one skilled in the art that other methods of determining the address may be used.

In step 715, the memory 100 adjusts the COLUMN address to correspond to a requested burst order.

In step 717, the memory controller 101 asserts and then deasserts the CAS signal to produce a pulse having a second edge.

In step 720, the memory 100 drives a data at COLUMN address in response to the second edge of the CAS signal.

In step 722, since the memory 100 is not in the address strobe state, the memory 100 computes a new COLUMN address based on the last strobed COLUMN address in response to the last edge of the CAS signal. As described above, the address for each cycle number in the burst sequence may therefore be represented as a function(last strobed COLUMN address, cycle number).

In step 725, the memory controller 101 asserts the MLAD signal.

In step 730, the memory controller 101 asserts and then deasserts the CAS signal to produce a pulse having an edge.

In step 735, the memory 100 drives a data at the new COLUMN address in response to the last edge of the CAS signal.

In step 740, the set of latches 102 latches the data at the previous COLUMN address in response to the last edge of the CAS signal and the state of the MLAD signal.

In step 745, the memory 100 updates a state machine that indicates whether to strobe a new address (COLUMN address) or to use the last strobed COLUMN address to compute the new address (COLUMN address).

In step 750, the memory 100 determines whether to strobe the COLUMN address.

In step 755, if the memory 100 is in the address strobe state, the memory 100 strobes the COLUMN address in response to the last edge of the CAS signal.

In step 760, the memory 100 adjusts the COLUMN address to correspond to a burst order and continues at step 770.

In step 765, if the memory 100 is not in the address strobe state, the memory 100 computes a new COLUMN address based on the last strobed COLUMN address in response to the last edge of the CAS signal.

In step 770, the memory controller 101 selectively drives a pulse on the READY bus 105 to ignore data that is not requested by the processor 103 or the busmaster 114, but which was requested as part of a burst cycle that matches the burst order of the processor 103 or the busmaster 114 or requested as a byproduct of another function such as the latching of a data. Data is ignored by pulsing the CAS signal to drive the data out and update the state machine and the address counter, but not pulsing the READY signal so that the processor 103 or the busmaster 114 does not latch the data.

In step 775, the memory controller 101 determines whether another CAS pulse is to be generated. In one embodiment, the method continues at step 730 until the last requested data of a burst cycle is latched by the processor 103 or the busmaster 114. In another embodiment, the method continues at step 730 after the last requested data of a burst cycle is latched by the processor 103 or the busmaster 114 until the memory 100 returns to the address strobe state. In still another embodiment, the method continues at step 730 until the last data of a burst cycle containing at least one requested data is latched by the processor 103 or the busmaster 114. In another embodiment, the method continues at step 730 after the last data of a burst cycle containing at least one requested data is latched by the processor 103 or the busmaster 114 until the memory 100 returns to the address strobe state.

In step 780, the MLAD signal is deasserted.

In one embodiment of the computer system of FIG. 1, the memory 100 may consist EDO DRAMs in combination with BEDO DRAMs. In such systems, logic for interfacing to EDO DRAMs is included. An EDO DRAM strobes a new column address on each falling edge of the CAS signal. It is similar to a BEDO DRAM in that the data is driven until the next falling edge of the CAS signal or until the RAS signal is deasserted.

Figure 8:
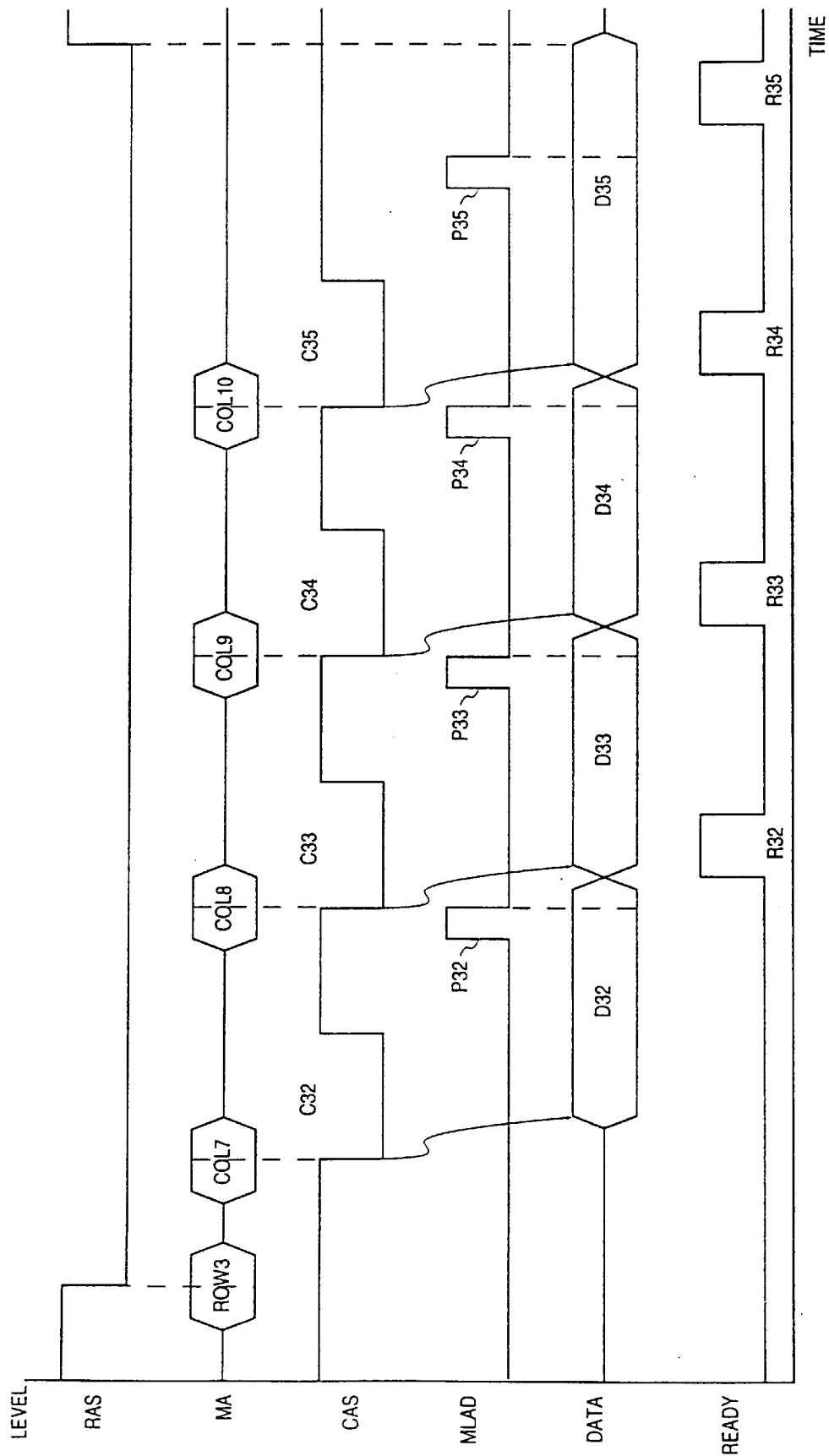
FIG. 8 is a timing diagram illustrating the access of an EDO DRAM in accordance with the teachings of the present invention.

FIG. 8 illustrates a timing diagram of one embodiment of the method of accessing EDO DRAMs. A first portion of an address (ROW3 address) is strobed on the falling edge of the RAS signal as described above. The memory controller 101 drives pulses C32 through C35 to cause the memory to strobe column addresses COL7 address through COL10 address, respectively, and drive data D32 at (ROW3 address):(COL7 address), data D33 at (ROW3 address):(COL8 address), data D34 at (ROW3 address):(COL9 address), and data D35 at (ROW3 address):(COL10 address), respectively.

In interfacing with an EDO DRAM, however, a pulse of the MLAD signal (rather than the CAS signal) is used to cause the set of latches 102 to latch the data on the data bus 113. Although this requires that the MLAD signal be held to tighter timing constraints than the method described for BEDO DRAMs, the longer cycle times of the EDO DRAM provide enough margin to use the less expensive method of using timing margins to guarantee the proper timing relationship between the timing of edges of MLAD and the timing of edges of the CAS signal.

The memory controller 101 asserts and then deasserts the MLAD signal to produce a Pulse P32 which causes the set of latches to latch data D32. The memory controller 101 then drives pulse R32 on the READY signal to indicate that data D32 is being driven on the data bus 113 and may be strobed by the processor 103 or the busmaster 114. Similarly, the memory controller 101 asserts and then deasserts the MLAD signal three times to produce pulse C33, pulse C34, and pulse C35 which cause the memory 100 to drive data D33, data D34, and data D35, respectively. The memory controller 101 also drives pulse R33, pulse R34, and pulse R35 on the READY bus 105 to indicate that data D33, data D34, and data D35, respectively, are being driven on the data bus 113 and may be strobed by the processor 103.

Figure 9:
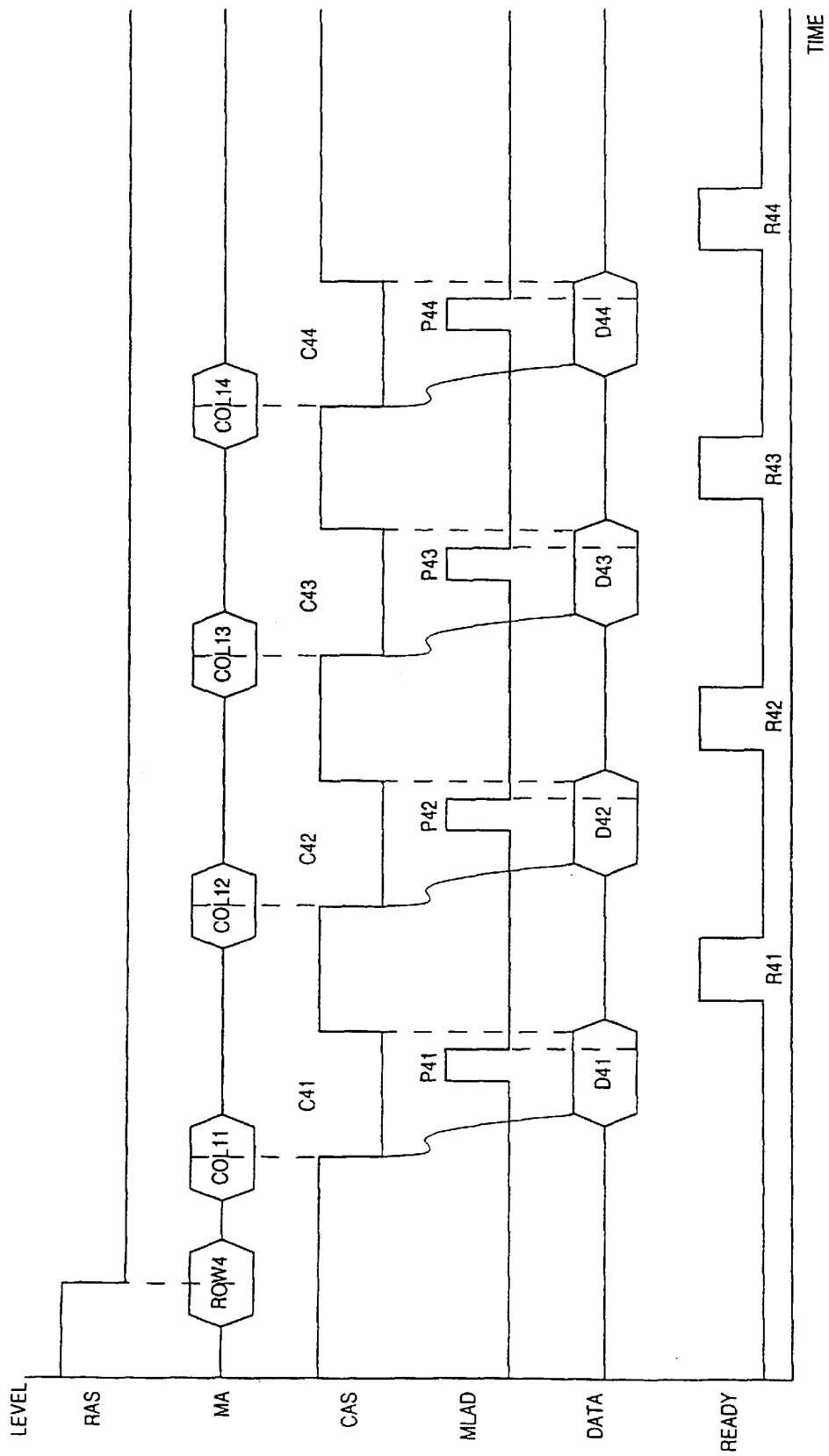
FIG. 9 is a timing diagram illustrating the access of a Fast Page-Mode DRAM in accordance with the teachings of the present invention.

In one embodiment of the computer system of FIG. 1, the memory 100 may consist Fast Page-Mode DRAMs in combination with BEDO DRAMs. In such systems, logic for interfacing to Fast Page-Mode DRAMs is included. A Fast Page-Mode DRAM strobes a new column address on each falling edge of the CAS signal. It also distinguished from a BEDO DRAM in that the data is driven until the rising edge of the CAS signal. FIG. 9 illustrates a timing diagram of one embodiment of the method of accessing EDO DRAMs. A first portion of an address (ROW4 address) is strobed on the falling edge of the RAS signal as described above. The memory controller 101 asserts and then deasserts the CAS signal to produce pulses C41 through C44 which cause the memory to strobe column addresses COL11 through COL14, respectively, and drive data D41 at (ROW4 address):(COL11 address), data D42 at (ROW4 address):(COL12 address), data D43 at (ROW4 address):(COL13 address), and data D44 at (ROW4 address): (COL 14 address), respectively.

As with an EDO DRAM, a pulse of the MLAD signal (rather than the CAS signal) is used to cause the set of latches 102 to latch the data on the data bus 113. As with the EDO DRAM, this method requires that the MLAD signal be held to tighter timing constraints than the method described for BEDO DRAMs. The longer cycle times of the Fast Page-Mode DRAM provides enough margin to use the less expensive method of using timing margins to guarantee the proper timing relationship between the timing of edges of MLAD and the timing of edges of the CAS signal.

The memory controller 101 asserts and then deasserts the MLAD signal to produce a pulse P41 which causes the set of latches 102 to latch data D41. The memory controller 101 then drives pulse R41 on the READY signal to indicate that data D41 is being driven on the data bus 113 and may be strobed by the processor 103 or the busmaster 114. Similarly, the memory controller 101 asserts and then deasserts the MLAD signal three times to produce a pulse P42, a pulse P43, and a pulse P44 to cause the memory 100 drive data D42, data D43, and data D44, respectively. The memory controller 101 also drives pulse R42, pulse R43, and pulse R44 on the READY signal to indicate that data D42, data D43, and data D44, respectively, are being driven on the data bus 113 and may be strobed by the processor 103 or the busmaster 114.

Other embodiments of the present invention may be implemented. For example, reference is made to various edges of signals. It will be apparent to one skilled in the art that these edges may be the falling edges of a signal, the rising edge of a signal or both the rising and falling edge of the signal. It will be apparent to one skilled in the art that other methods of signalling the time of events, such as driving or latching data, may be used. In addition, reference is made to asserted signals corresponding to various levels. It will be apparent to one skilled in the art that different levels may be used for an asserted signal.

What is claimed is:

1. A method for accessing a memory comprising the steps of:
   producing a first edge of a plurality of edges of a first signal;
   driving a first data in response to said first edge of said first signal;
   driving a second signal into a first state;
   producing a second edge of said plurality of edges of said first signal; and
   latching said first data in response to said second edge of said first signal and said second signal being in said first state.

2. The method of claim 1 further comprising the steps of:
   driving a second data in response to said second edge of said first signal;
   strobing at least a portion of a first address in response to one of said plurality of edges of said first signal, said second data corresponding to said first address.

3. The method of claim 1 further comprising the steps of:
   driving a second data in response to said second edge of said first signal;
   strobing at least a portion of a first address in response to one of said plurality of edges of said first signal; and
   generating a second address based on said first address in response to one of said plurality of edges of said first signal, said second data corresponding to said second address.

4. The method of claim 1 further comprising the steps of:
   driving said second signal into a second state; and
   disabling latching in response to said second state of said second signal.

5. The method of claim 1 further comprising the steps of:
   receiving at least one data request, said at least one data request being outstanding until corresponding data are latched;
   driving at least one edge of said first signal during a period in which said at least one data request is not outstanding;
   causing a state machine to change to a second state in response to said at least one said edge of said first signal; and
   strobing at least a portion of an address in response to said second edge of said first signal and said second state.

6. The method of claim 1 further comprising the steps of:
   receiving a data request for at least one data element;
   initiating a burst cycle corresponding to a plurality of cycles, each of said plurality of cycles corresponding to one of a plurality of data elements, said plurality of data elements comprising said at least one data element and at least one additional data element;
   driving at least one edge of said first signal, each of at least one of said at least one said edge of said first signal corresponding to one of said at least one said data element;
   aborting said burst cycle; and
   strobing at least a portion of an address in response to a second edge of said first signal and to said at least one edge of said first signal.

7. The method of claim 1 further comprising the steps of:
   producing a third edge of said plurality of edges of said first signal;
   driving a second data in response to said third edge of said first signal;
   determining whether said memory is of a first type or a second type;
   producing a first edge of said second signal, if said memory is of said first type;
   producing a fourth edge of said plurality of edges of said first signal and driving said second signal into said first state, if said memory is of said second type; and
   latching said second data in response to said first edge of said second signal, if said memory is of said first type and latching said second data in response to said fourth edge of said first signal and said first state of said second signal, if said memory is of said second type.

8. The method of claim 1 further comprising the step of strobing at least a portion of a first address in response to one of said plurality of edges of said first signal, said first data corresponding to said first address.

9. The method of claim 8 further comprising the step of generating a second address based on said first address in response to one of said plurality of edges of said first signal.

10. The method of claim 1 further comprising the steps of:
    receiving a request for a plurality of data elements in a first order;
    receiving a first address;
    determining whether a first burst order corresponding to said first address corresponds to said plurality of data elements in said first order; and
    if said first burst order corresponding to said first address does not correspond to said plurality of data elements in said first order, modifying said first address to a second address, said second address corresponding to a second burst order that corresponds to said plurality of data elements in said first order.

11. The method of claim 10, wherein said second burst order comprises at least one data element in addition to said plurality of data elements, said method further comprising the step of:
    driving a fourth signal to said first state when the corresponding data is one of said plurality of data elements; and
    driving said fourth signal to a second state when the corresponding data is one of said at least one data element.

12. A memory controller for accessing a memory, said memory controller producing a first edge of a plurality of edges of a first signal to cause a first data to be driven in response to said first edge of said first signal, and driving a second signal into a first state and producing a second edge of said plurality of edges of said first signal to cause said first data to be latched in response to said second edge of said first signal and said second signal being in said first state.

13. The memory controller of claim 12, said memory controller causing said memory to drive a second data in response to said second edge of said first signal and to strobe at least a portion of a first address in response to one of said plurality of edges of said first signal, said second data corresponding to said first address.

14. The memory controller of claim 12, said memory controller causing said memory to drive a second data in response to said second edge of said first signal and to strobe at least a portion of a first address in response to one of said plurality of edges of said first signal and generating a second address based on said first address in response to one of said plurality of edges of said first signal, said second data corresponding to said second address.

15. The memory controller of claim 12, said memory controller driving said second signal into a second state to cause latching to be disabled.

16. The memory controller of claim 12, said memory controller receiving at least one data request, said at least one data request being outstanding until corresponding data are latched, driving at least one edge of said first signal during a period in which said at least one data request is not outstanding, and causing said memory to strobe a portion of an address in response to said second edge of said first signal and at least one edge of said first signal.

17. The memory controller of claim 12, said memory controller receiving a data request for at least one data element, initiating a burst cycle corresponding to a plurality of cycles, each of said plurality of cycles corresponding to one of a plurality of data elements, said plurality of data elements comprising said at least one data element and at least one additional data element, driving at least one edge of said first signal, each of at least one of said at least one said edge of said first signal corresponding to one of said at least one said data element, aborting said burst cycle, and causing said memory to strobe at least a portion of an address corresponding to said second edge of said first signal and in response to said at least one edge of said first signal.

18. The memory controller of claim 12, said memory controller determining whether said memory is of a first type or a second type and producing a third edge of said plurality of edges of said first signal, said memory controller producing a first edge of said second signal, if said memory is of said first type; producing a fourth edge of said plurality of edges of said first signal and driving said second signal into said first state, if said memory is of said second type, said third edge of said plurality of edges of said first signal indicating to drive a second data, said first edge of said second signal indicating to latch said second data, if said memory is of said first type and said fourth edge of said first signal and said first state of said second signal indicating to latch said second data, if said memory is of said second type.

19. The memory controller of claim 12, said memory controller providing at least a portion of a first address corresponding to one of said plurality of edges of said first signal, said first data corresponding to said first address.

20. The memory controller of claim 12, said memory controller causing said memory to drive a second data in response to a second edge of said first signal and to strobe at least a portion of a first address in response to one of said plurality of edges of said first signal.

21. The memory controller of claim 12, said memory controller receiving a first address and a request for a plurality of data elements in a first order, and determining whether a first burst order corresponding to said first address corresponds to said plurality of data elements in said first order such that if said first burst order corresponding to said first address does not correspond to said plurality of data elements in said first order, said memory controller modifying said first address to a second address, said second address corresponding to a second burst order that corresponds to said plurality of data elements in said first order.

22. The memory controller of claim 21, wherein said second burst order comprises at least one data element in addition to said plurality of data elements, said memory controller driving a fourth signal to a first state when the corresponding data is one of said plurality of data elements, and driving said fourth signal to a second state when the corresponding data is one of said at least one data element.

23. A computer system comprising:
 a memory controller;
 a processor coupled to said memory controller;
 a memory coupled to receive a first signal from said memory controller, said memory driving a first data in response to a first edge of said first signal;
 a latch coupled to receive said first signal and a second signal from said memory controller, said second signal selectively enabling said latch, said first data being latched to in response to a second edge of said first signal when said latch is enabled.

24. The computer system of claim 23 wherein said memory controller is coupled to receive at least one data request from said processor, said at least one data request being outstanding until corresponding data are latched, said memory controller driving at least one edge of said first signal during a period in which said at least one data request is not outstanding to cause said memory to change to a second state, and strobing at least a portion of an address in response to said second edge of said first signal and said at least one of said at least one edge of said first signal.

25. The computer system of claim 23, wherein said memory controller is coupled to receive a data request for at least one data element, said memory controller initiating a burst cycle corresponding to a plurality of cycles, driving at least one edge of said first signal, aborting said burst cycle, and said memory strobing at least a portion of an address corresponding to a second edge of said first signal and in response to said at least one edge of said first signal, each of at least one of said at least one said edge of said first signal corresponding to one of said at least one said data element, each of said plurality of cycles corresponding to one of a plurality of data elements, and said plurality of data elements comprising said at least one data element and at least one additional data element.

26. The computer system of claim 23, wherein said memory controller determining whether said memory is of a first type or a second type and producing a third edge of said plurality of edges of said first signal, said memory controller producing a first edge of said second signal, if said memory is of said first type; producing a fourth edge of said plurality of edges of said first signal and driving said second signal into said first state, if said memory is of said second type, said memory being operable to drive a second data in response to said third edge of said plurality of edges of said first signal, said latch being operable to latch said second data in response to said first edge of said second signal, if said memory is of said first type and latch said second data in response to said fourth edge of said first signal and said first state of said second signal, if said memory is of said second type.

27. The computer system of claim 23 wherein said memory is coupled to receive at least a portion of a first address corresponding to an edge of said first signal, said first data corresponding to said first address.

28. The computer system of claim 23 wherein said memory strobes at least a portion of a first address in response to an edge of said first signal and drives a second data in response to said second edge of said first signal.

29. The computer system of claim 23 wherein said memory strobes at least a portion of a first address in response to an edge of said first signal and drives a second data in response to said second edge of said first signal, said second data corresponding to said first address.

30. The computer system of claim 29 wherein said memory generates a second address based on said first address in response to one of said plurality of edges of said first signal, said second data corresponding to said second address.

31. The computer system of claim 23, said memory controller coupled to receive a first address and a request for a plurality of data elements in a first order, said memory controller determining whether a first burst order corresponding to said first address corresponds to said plurality of data elements in said first order such that if said first burst order corresponding to said first address does not correspond to said plurality of data elements in said first order, said memory controller modifying said first address to a second address, said second address corresponding to a second burst order that corresponds to said plurality of data elements in said first order.

32. The computer system of claim 31, wherein said second burst order comprises at least one data element in addition to said plurality of data elements, said processor being coupled to receive a fourth signal from said memory controller to indicate whether the corresponding data is one of said plurality of data elements or one of said at least one data element.

* * * * *

UNITED STATES PATENT AND TRADEMARK OFFICE
CERTIFICATE OF CORRECTION

| | | |
|---|---|---|
| PATENT NO. | : | 5,860,128 |
| DATED | : | January 12, 1999 |
| INVENTOR(S) | : | Murdoch, et al. |

It is certified that error appears in the above-identified patent and that said Letters Patent is hereby corrected as shown below:

In column 5 at line 66 delete "to" and insert --t0--

In column 16 at line 33 delete "10," and insert --10--

Signed and Sealed this

Twenty-eighth Day of December, 1999

Attest:

Q. TODD DICKINSON

*Attesting Officer*     *Acting Commissioner of Patents and Trademarks*

UNITED STATES PATENT AND TRADEMARK OFFICE
CERTIFICATE OF CORRECTION

PATENT NO.   : 5,860,128
DATED        : January 12, 1999
INVENTOR(S)  : Murdoch et al.

It is certified that error appears in the above-identified patent and that said Letters Patent is hereby corrected as shown below:

In column 3, at line 54, before "the" and after "signal" insert --on--.

Signed and Sealed this

Twenty-third Day of May, 2000

Attest:

Q. TODD DICKINSON

*Attesting Officer*     *Director of Patents and Trademarks*